United States Patent
Cai

(10) Patent No.: US 11,329,259 B2
(45) Date of Patent: May 10, 2022

(54) DISPLAY PANEL COMPRISING CAPACITOR STRUCTURE BETWEEN FIRST PLATE AND SECOND PLATE, AND METHOD OF FABRICATING THEREOF

(71) Applicant: SHENZHEN CHINA STAR OPTOELECTRONICS SEMICONDUCTOR DISPLAY TECHNOLOGY CO., LTD., Shenzhen (CN)

(72) Inventor: Zhenfei Cai, Shenzhen (CN)

( * ) Notice: Subject to any disclaimer, the term of this patent is extended or adjusted under 35 U.S.C. 154(b) by 323 days.

(21) Appl. No.: 16/616,502

(22) PCT Filed: Aug. 5, 2019

(86) PCT No.: PCT/CN2019/099263
§ 371 (c)(1),
(2) Date: Nov. 25, 2019

(87) PCT Pub. No.: WO2020/228149
PCT Pub. Date: Nov. 19, 2020

(65) Prior Publication Data
US 2021/0359279 A1    Nov. 18, 2021

(30) Foreign Application Priority Data
May 15, 2019 (CN) .......................... 201910402801.3

(51) Int. Cl.
*H01L 51/52* (2006.01)
*H01L 27/32* (2006.01)
*H01L 51/56* (2006.01)

(52) U.S. Cl.
CPC ...... *H01L 51/5284* (2013.01); *H01L 27/3265* (2013.01); *H01L 51/56* (2013.01); *H01L 2227/323* (2013.01)

(58) Field of Classification Search
USPC ......................................................... 257/40
See application file for complete search history.

(56) References Cited

U.S. PATENT DOCUMENTS

2017/0338252 A1* 11/2017 Lee .................. H01L 29/78633
2018/0190744 A1*  7/2018 Oh .................... H01L 27/124
2021/0327987 A1* 10/2021 Fang .................. H01L 27/3276

* cited by examiner

*Primary Examiner* — Nduka E Ojeh

(57) ABSTRACT

A display panel and method of fabricating thereof. The display panel includes a capacitor structure, a first plate of the capacitor structure includes an active region and a light shielding metal layer which are electrically connected, and a second plate of the capacitor structure includes an anode and a capacitor metal layer which are electrically connected. The anode and the active region are disposed correspondingly, and at least two insulating layers are disposed between the anode and the active region, the light shielding metal layer and the capacitor metal layer are disposed correspondingly, and at least two insulating layers are disposed between the light shielding metal layer and the capacitor metal layer.

16 Claims, 2 Drawing Sheets

DISPLAY PANEL COMPRISING CAPACITOR STRUCTURE BETWEEN FIRST PLATE AND SECOND PLATE, AND METHOD OF FABRICATING THEREOF

CROSS REFERENCE TO RELATED APPLICATION

This application claims the priority of International Application No. PCT/CN2019/099263, filed on 2019 Aug. 5, which claims priority to Chinese Application No. 201910402801.3, filed on 2019 May 15. The entire disclosures of each of the above applications are incorporated herein by reference.

BACKGROUND OF INVENTION

Field of Invention

The present invention relates to the field of electronic display, and in particular, to a display panel and a method of fabricating thereof.

Description of Prior Art

Active matrix organic light emitting diodes are mainstream choices for next-generation displays because of their high contrast ratio, wide viewing angles and fast response speed. In a display panel, in order to ensure normal writing of each frame of data and to ensure normal illumination of each pixel, storage capacitors in pixel driving circuits are required to be sufficiently large.

Technical Problem

Referring to FIG. 1, in current display panels, capacitor structures are planar capacitor structures formed by an upper plate and a lower plate. An active region 040 and an anode 080 are electrically connected through via holes to form a first plate of the capacitor structure. Source and drain metal layers constitute a second plate of the capacitor structure. Since the first plate and the second plate are separated by only one insulating layer, when foreign matter or defects are in the interlayer dielectric layer or the planarization layer, the capacitor will be shorted. Once shorting happened, pixels will not capable to illuminate normally due to capacitor failure. Therefore, there is an urgent need to solve this problem.

SUMMARY OF INVENTION

The present application provides a display panel and a fabricating method thereof to solve the technical problem that display panels in the prior art are easily disabled due to a short circuit of a capacitor.

In order to solve the above problems, the present application provides a display panel, wherein the display panel comprises a capacitor structure, a first plate of the capacitor structure comprises an active region and a light shielding metal layer which are electrically connected, and a second plate of the capacitor structure comprises an anode and a capacitor metal layer which are electrically connected;

wherein the anode and the active region are disposed correspondingly, and at least two insulating layers are disposed between the anode and the active region;

wherein the light shielding metal layer and the capacitor metal layer are disposed correspondingly, and at least two insulating layers are disposed between the light shielding metal layer and the capacitor metal layer.

According to one aspect of the application, wherein the two insulating layers disposed between the anode and the active region comprise an interlayer dielectric layer and a planarization layer.

According to one aspect of the application, wherein the two insulating layers disposed between the light shielding metal layer and the capacitor metal layer comprise a buffer layer and an interlayer dielectric layer.

According to one aspect of the application, wherein the display panel comprises:

a substrate;

the light shielding metal layer is located on the substrate, and the buffer layer covers the light shielding metal layer;

the active region is located on the buffer layer and is electrically connected to the light shielding metal layer through a first via hole, the active region comprises a channel region and a source region and a drain region disposed on both sides of the channel region;

a gate stack disposed on the active region and covering the channel region, the interlayer dielectric layer covering the active region and the gate stack;

a source/drain metal layer disposed on the interlayer dielectric layer, and is electrically connected to the source region and drain region through a second via hole penetrating through the interlayer dielectric layer, the capacitor metal layer is disposed above the interlayer dielectric layer and spaced apart from the source/drain metal layer, the planarization layer covers the source/drain metal layer and the capacitor metal layer, the anode is disposed on the planarization layer and is electrically connected to the source/drain metal layer and the capacitor metal layer through a third via hole respectively;

a light emitting structure disposed on the anode.

According to one aspect of the application, wherein a projection of the capacitive metal layer on the substrate separates from a projection of the active region on the substrate.

According to one aspect of the application, wherein a projection of the light shielding metal layer on the substrate covers a projection of the capacitive metal layer on the substrate.

According to one aspect of the application, wherein a projection of the anode on the substrate covers a projection of the active region on the substrate.

The present application further provides a method of fabricating a display panel, wherein the method comprises the steps of:

providing a substrate;

forming a light shielding metal layer and an active region on the substrate to form a first plate of a capacitor structure;

forming at least two insulating layers covering the first plate;

forming an anode and a capacitor metal layer on the at least two insulating layers to form a second plate of the capacitor structure;

wherein the anode and the active region are disposed correspondingly, and at least two insulating layers are disposed between the anode and the active region;

wherein the light shielding metal layer and the capacitor metal layer are disposed correspondingly, and at least two insulating layers are disposed between the light shielding metal layer and the capacitor metal layer;

a light emitting structure is formed on the second plate.

According to one aspect of the application, wherein the at least two insulating layers disposed between the anode and the active region comprise an interlayer dielectric layer and a planarization layer.

According to one aspect of the application, wherein the two insulating layers disposed between the light shielding metal layer and the capacitor metal layer comprise a buffer layer and an interlayer dielectric layer.

According to one aspect of the application, wherein the method of forming the first plate comprises the steps of:

forming a light shielding metal layer on the substrate;

forming a buffer layer covering the light shielding metal layer;

forming an active region, the active region is located on the buffer layer and is electrically connected to the light shielding metal layer through a first via hole, the active region comprises a channel region and a source region and a drain region on both sides of the channel region.

According to one aspect of the application, wherein after the forming the active region, the method further comprises the steps of:

forming a gate stack on the active region overlying the channel region;

forming an interlayer dielectric layer covering the active region and the gate stack.

According to one aspect of the application, wherein the method of forming the second plate comprises the steps of:

forming a source/drain metal layer, the source/drain metal layer is disposed on the interlayer dielectric layer and electrically connected to the source region and drain region through a via hole penetrating the interlayer dielectric layer;

forming the capacitor metal layer, the capacitor metal layer is disposed above the interlayer dielectric layer and is spaced apart from the source/drain metal layer;

forming the planarization layer, the planarization layer covers the source/drain metal layer and the capacitor metal layer;

forming the anode, the anode is disposed on the planarization layer, and is electrically connected to the source/drain metal layer and the capacitor metal layer through via holes respectively;

forming the light emitting structure, the light emitting structure is located on the anode.

According to one aspect of the application, wherein a projection of the capacitive metal layer on the substrate separates from a projection of the active region on the substrate.

According to one aspect of the application, wherein a projection of the light shielding metal layer on the substrate covers a projection of the capacitor metal layer on the substrate.

According to one aspect of the application, wherein a projection of the anode on the substrate covers a projection of the active region on the substrate.

Beneficial Effects

The present application changes configurations of two plates of a capacitance structure of a display panel in the prior art. An anode of a display panel of the present application is electrically connected to a capacitor metal layer to form a first plate of the capacitor structure. At the same time, an active region and a light shielding metal layer are electrically connected to form a second plate of the capacitor structure. Because the anode and the active region are separated by at least two insulating layers, the light shielding metal and the capacitor metal layer are also separated by at least two insulating layers, the display panel of the present application can effectively avoid the short circuit of the capacitor, thereby improving the reliability and the service life of the display panel.

DETAILED DESCRIPTION OF PREFERRED EMBODIMENTS

Figure 1:
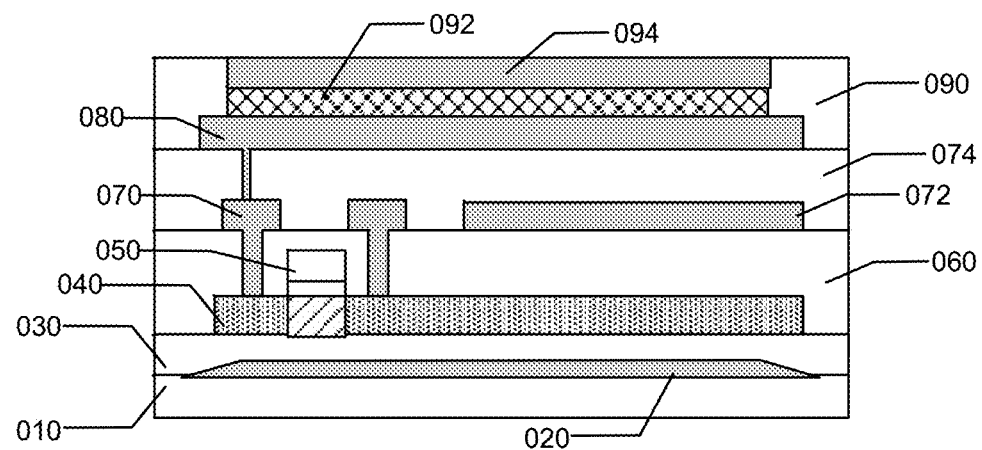
FIG. 1 is a structural diagram of a display panel in the prior art.

Description of following embodiment, with reference to accompanying drawings, is used to exemplify specific embodiments which may be carried out in the present disclosure. Directional terms mentioned in the present disclosure, such as "top", "bottom", "front", "back", "left", "right", "inside", "outside", "side", etc., are only used with reference to orientation of the accompanying drawings. Therefore, the directional terms are intended to illustrate, but not to limit, the present disclosure. In the drawings, components having similar structures are denoted by same numerals.

First, the prior art will be briefly described. Referring to FIG. 1, FIG. 1 is a schematic structural diagram of a display panel in the prior art. The display panel includes a substrate 010, a light shielding layer 020, a buffer layer 030, an active region 040, a gate stack 050, an interlayer dielectric layer 060, a source/drain metal layer 070, a capacitor metal layer 072, a planarization layer 074 and a light emitting structure on the planarization layer 074. The light emitting structure includes an anode 080, a pixel defining layer 090, a light emitting material 092, and a cathode 094.

In the display panel of FIG. 1, capacitor structures are planar capacitor structures formed by an upper plate and a lower plate. An active region 040 and an anode 080 are electrically connected through via holes to form a first plate of the capacitor structure. Source and drain metal layers constitute a second plate of the capacitor structure. Since the first plate and the second plate are separated by only one insulating layer, when foreign matter or defects arein the interlayer dielectric layer or the planarization layer, the capacitor will be shorted. Once shorted happened, pixels will not capable to illuminate normally due to capacitor failure.

Using a light shielding layer and an anode as the two plates of the capacitor structure can increase the distance between the two plates of the capacitor structure, but the distance between the two plates would be too large and result in a small capacitance value, which also affects the display function of the display panel.

Therefore, the present application provides a display panel and a fabricating method thereof to solve the technical problem that display panels in the prior art are easily disabled due to a short circuit of a capacitor.

Figure 8:
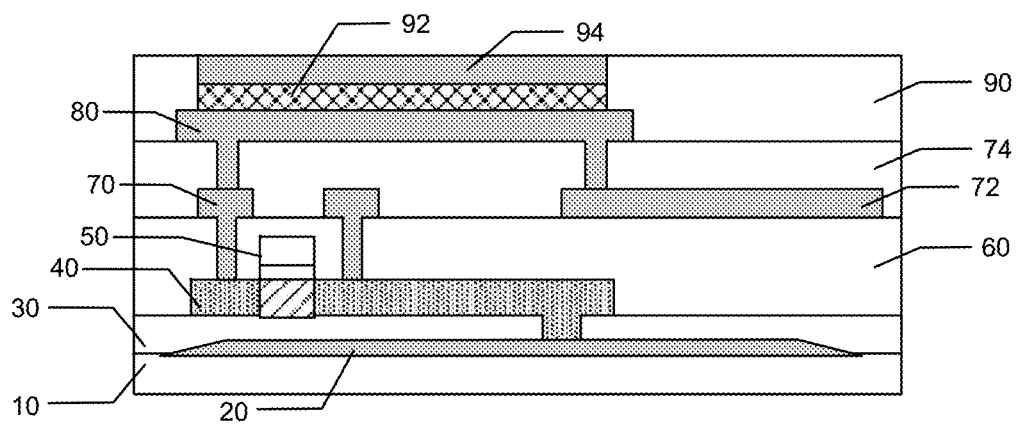
FIG. 8 is a structural diagram of a display panel in an embodiment of the present application.

Referring to FIG. 8, FIG. 8 is a structural diagram of a display panel in an embodiment of the present application. The display panel includes a substrate 10, a light shielding metal layer 20, a buffer layer 30, an active region 40, a gate stack 50, an interlayer dielectric layer 60, a source/drain metal layer 70, a capacitor metal layer 72, a planarization layer 74, an anode 80, and a light emitting structure. The light emitting structure is disposed on the anode 80.

A first plate of the capacitor structure comprises an active region 40 and a light shielding metal layer 20 which are electrically connected, and a second plate of the capacitor structure comprises an anode 80 and a capacitor metal layer 72 which are electrically connected. Wherein the anode 80 and the active region 40 are disposed correspondingly, and at least two insulating layers are disposed between the anode 80 and the active region 40. The light shielding metal layer 20 and the capacitor metal layer 72 are disposed correspondingly, and at least two insulating layers are disposed between the light shielding metal layer 20 and the capacitor metal layer 72.

In the present embodiment, the two insulating layers disposed between the anode 80 and the active region 40 include an interlayer dielectric layer 60 and a planarization layer 74. The two insulating layers disposed between the light shielding metal layer 20 and the capacitor metal layer 72 include a buffer layer 30 and an interlayer dielectric layer 60.

In this embodiment, the display panel can be a liquid crystal panel or an organic light emitting diode display panel. The substrate 10 can be a rigid substrate such as glass or a flexible substrate such as a polyimide film.

The light shielding metal layer 20 is located on the substrate 10. The light shielding metal layer 20 is used to block light entering the active region 40 from the outside, and to avoid carrier mobility of the active region being affected by illumination. Therefore, the light shielding metal layer 20 is disposed corresponding to the gate stack 50. A projection of the light shielding metal layer 20 on the substrate 10 completely covers a projection of the gate stack 50 on the substrate 10.

The buffer layer 30 covers the light shielding metal layer 20. The buffer layer 30 has at least one first via hole, and the first via hole exposes the light shielding metal layer 20.

The active region 40 is located on the buffer layer 30 and electrically connected to the light shielding metal layer 20 through the first via hole. The active region 40 includes a channel region and a source region and a drain region on both sides of the channel region.

The gate stack 50 is over the active region 40 and covers the channel region. Typically, the gate stack 50 includes a gate dielectric layer and a gate metal layer. The interlayer dielectric layer 60 covers the active region 40 and the gate stack 50. The interlayer dielectric layer 60 has at least one second via hole that exposes the active region 40.

The source/drain metal layer 70 disposed on the interlayer dielectric layer 60, and is electrically connected to the source region and drain region through a second via hole penetrating through the interlayer dielectric layer 60, the capacitor metal layer 72 is disposed above the interlayer dielectric layer 60 and spaced apart from the source/drain metal layer 70. The planarization layer 74 covers the source/drain metal layer 70 and the capacitor metal layer 72. The planarization layer 74 has at least one third via hole exposing the source/drain metal layer 70 and the capacitor metal layer 72.

The anode 80 is disposed on the planarization layer 74 and is electrically connected to the source/drain metal layer 70 and the capacitor metal layer 72 through a third via hole respectively. The light emitting structure disposed on the anode 80.

Specifically, referring to FIG. 8, the light emitting structure includes a pixel defining layer 90, a light emitting material 92, and a cathode 94. The pixel defining layer 90 has a via hole exposing the anode 80. The light emitting material 92 is located on the anode 80, and the cathode 94 covers the light emitting material 92.

Referring to FIG. 8, in the present embodiment, the anode 80 and the capacitor metal layer 72 are connected to a same potential to form a first plate of the capacitor structure. The active region 40 and the light shielding metal 20 are connected to a same potential to form a second plate of the capacitor structure. According to the structure of the display panel, the minimum distance between the two plates of the capacitor structure is the distance between the active region 40 and the capacitor metal layer 72. In order to increase the minimum distance between the two plates of the capacitive structure, a projection of the capacitive metal layer 72 on the substrate 10 separates from or partially overlap with a projection of the active region 40 on the substrate 10.

In the present embodiment, in order to enhance the effective area of the capacitor structure, a projection of the light shielding metal layer 20 on the substrate 10 covers a projection of the capacitor metal layer 72 on the substrate 10. A projection of the anode 80 on the substrate 10 covers a projection of the active region 40 layer on the substrate 10. This arrangement enables the two plates of the capacitive structure to correspond to each other as much as possible, enhancing the capacitance value of the pixel.

In another embodiment of the present application, the display panel further includes a second gate stack and a second interlayer dielectric layer between the interlayer dielectric layer 60 and the planarization layer 74. The second gate stack is located directly above the gate stack 50. The second gate dielectric layer covers the second gate stack and the interlayer dielectric layer 60. The source/drain metal layer 70 is located above the second interlayer dielectric layer and is electrically connected to the source and drain regions through via holes. On the one hand, an arrangement of the second gate structure can increase the gate control capability of the thin film transistor, and increase the distance between the two plates of the capacitor structure at the same time, thereby reduce the risk of short circuit of the two plates of the capacitor structure.

Correspondingly, referring to FIG. 2 to FIG. 7, the present application further provides a method of fabricating a display panel, wherein the method includes the following steps:

providing a substrate 10;

forming a light shielding metal layer 20 and an active region 40 on the substrate lo to form a first plate of a capacitor structure;

forming at least two insulating layers covering the first plate;

forming an anode 80 and a capacitor metal layer 72 on the at least two insulating layers to form a second plate of the capacitor structure;

wherein the anode 80 and the active region 40 are disposed correspondingly, and at least two insulating layers are disposed between the anode 80 and the active region 40;

wherein the light shielding metal layer 20 and the capacitor metal layer 72 are disposed correspondingly, and at least two insulating layers are disposed between the light shielding metal layer 20 and the capacitor metal layer 72;

a light emitting structure is formed on the second plate.

Figure 2:
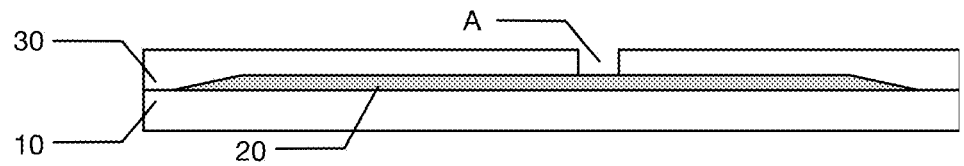
FIG. 2 is a structural diagram of a display panel in a specific embodiment of the present application.

Referring to FIG. 2, in the present embodiment, a substrate 10 is first provided, and a light shielding metal layer 20 is formed on the substrate 10, and then a buffer layer 30 covering the light shielding metal layer 20 is formed. The substrate 10 can be a rigid substrate such as glass or a flexible substrate such as a polyimide film. The light shielding metal layer 20 is located on the substrate 10. The light shielding metal layer 20 is used to block light entering the active region 40 from the outside, and to avoid carrier mobility of the active region being affected by illumination. Therefore, the light shielding metal layer 20 is disposed corresponding to the gate stack 50. A projection of the light shielding metal layer 20 on the substrate 10 completely covers a projection of the gate stack 50 on the substrate 10. The buffer layer 30 covers the light shielding metal layer 20. The buffer layer 30 has at least one first via hole, and the first via hole exposes the light shielding metal layer 20.

Figure 3:
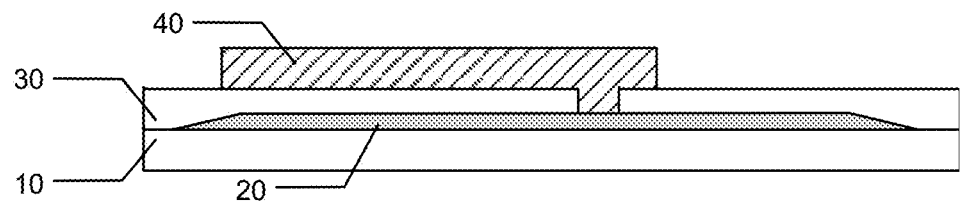
FIG. 3 is a structural diagram of the display panel of FIG. 2 after an active region is formed.

Thereafter, referring to FIG. 3, an active region 40 is formed. The active region 40 is located on the buffer layer 30 and electrically connected to the light shielding metal layer 20 through a first via hole. The active region 40 includes a channel region.

Figure 4:
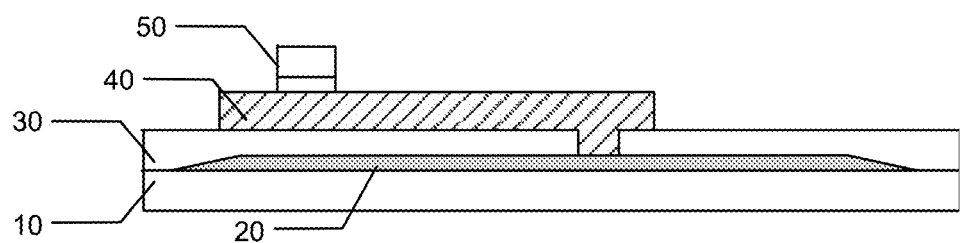
FIG. 4 is a structural diagram of a display panel of FIG. 3 after a gate stack is formed.

Thereafter, referring to FIG. 4, a gate stack 50 covering the channel region is formed over the active region 40. Typically, the gate stack 50 includes a gate dielectric layer and a gate metal layer.

Figure 5:
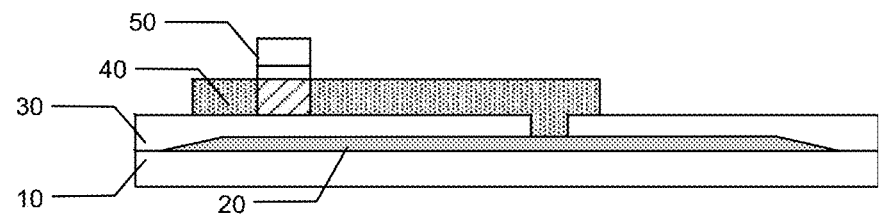
FIG. 5 is a structural diagram of a display panel of FIG. 4 after source and drain regions are formed.

Thereafter, referring to FIG. 5, the active region 40 is electrically conductive with the gate stack as a mask to form a channel region and source and drain regions on both sides of the channel region. Usually, the method of conducting is ion implantation.

Figure 6:
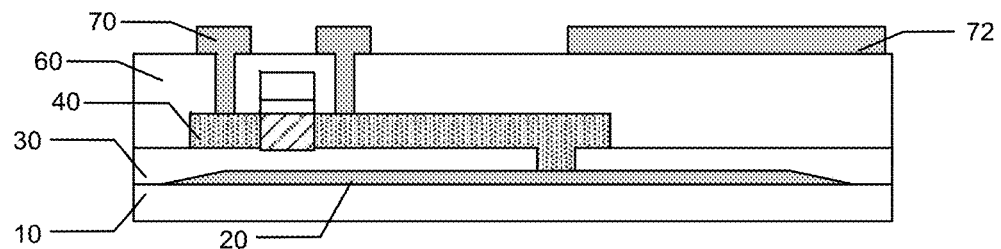
FIG. 6 is a structural diagram of a display panel of FIG. 5 after source and drain metal layers are formed.

Thereafter, referring to FIG. 6, an interlayer dielectric layer 60 covering the active region 40 and the gate stack, a source/drain metal layer 70 and a capacitor metal layer 72 covering the interlayer dielectric layer 60 are formed. The interlayer dielectric layer 60 covers the active region 40 and the gate stack 50. The interlayer dielectric layer 60 has at least one second via hole that exposes the active region 40. The source/drain metal layer 70 disposed on the interlayer dielectric layer 60, and is electrically connected to the source region and drain region through a second via hole penetrating through the interlayer dielectric layer 60, the capacitor metal layer 72 is disposed above the interlayer dielectric layer 60 and spaced apart from the source/drain metal layer 70.

Figure 7:
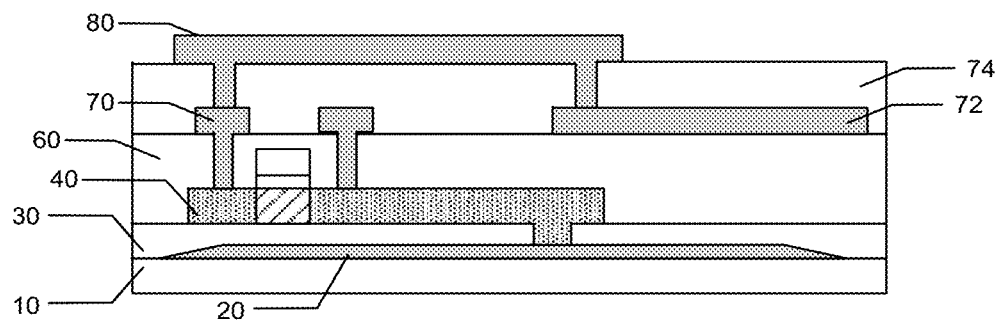
FIG. 7 is a structural diagram of a display panel of FIG. 6 after an anode is formed.

Thereafter, referring to FIG. 7, a planarization layer 74 and an anode 80 on the planarization layer 74 are formed. The planarization layer 74 covers the source/drain metal layer 70 and the capacitor metal layer 72. The planarization layer 74 has at least one third via hole exposing the source/drain metal layer 70 and the capacitor metal layer 72. The anode 80 is disposed on the planarization layer 74 and is electrically connected to the source/drain metal layer 70 and the capacitor metal layer 72 through a third via hole respectively. The light emitting structure disposed on the anode 80.

Finally, referring to FIG. 8, a light emitting structure is formed on the anode 80. The light emitting structure includes a pixel defining layer 90, a light emitting material 92, and a cathode 94. The pixel defining layer 90 has a via hole exposing the anode 80. The light emitting material 92 is located on the anode 80, and the cathode 94 covers the light emitting material 92.

In the present embodiment, the anode 80 and the capacitor metal layer 72 are connected to a same potential to form a first plate of the capacitor structure. The active region 40 and the light shielding metal 20 are connected to a same potential to form a second plate of the capacitor structure. According to the structure of the display panel, the minimum distance between the two plates of the capacitor structure is the distance between the active region 40 and the capacitor metal layer 72. In order to increase the minimum distance between the two plates of the capacitive structure, a projection of the capacitive metal layer 72 on the substrate 10 separates from or partially overlap with a projection of the active region 40 on the substrate 10.

In the present embodiment, in order to enhance the effective area of the capacitor structure, a projection of the light shielding metal layer 20 on the substrate 10 covers a projection of the capacitor metal layer 72 on the substrate 10. A projection of the anode 80 on the substrate 10 covers a projection of the active region 40 layer on the substrate 10. This arrangement enables the two plates of the capacitive structure to correspond to each other as much as possible, enhancing the capacitance value of the pixel.

In another embodiment of the present application, the display panel further includes a second gate stack and a second interlayer dielectric layer between the interlayer dielectric layer 60 and the planarization layer 74. The second gate stack is located directly above the gate stack 50. The second gate dielectric layer covers the second gate stack and the interlayer dielectric layer 60. The source/drain metal layer 70 is located above the second interlayer dielectric layer and is electrically connected to the source and drain regions through via holes. On the one hand, an arrangement of the second gate structure can increase the gate control capability of the thin film transistor, and increase the distance between the two plates of the capacitor structure at the same time, thereby reduce the risk of short circuit of the two plates of the capacitor structure.

As is understood by persons skilled in the art, the foregoing preferred embodiments of the present disclosure are illustrative rather than limiting of the present disclosure. It is intended that they cover various modifications and that similar arrangements be included in the spirit and scope of the present disclosure, the scope of which should be accorded the broadest interpretation so as to encompass all such modifications and similar structures.

What is claimed is:

1. A display panel, wherein the display panel comprises
   a substrate;
   a light shielding metal layer located on the substrate;
   a buffer layer covering the light shielding metal layer;
   an active region which is located on the buffer layer and is electrically connected to the light shielding metal layer through a first via hole;
   a source/drain metal layer disposed on the interlayer dielectric layer, and is electrically connected to the source region and drain region through a second via hole penetrating through the interlayer dielectric layer;
   an interlayer dielectric layer covering the active region;
   a capacitor metal layer which is disposed above the interlayer dielectric layer;
   a planarization layer covering the source/drain metal layer and the capacitor metal layer;
   an anode which is disposed on the planarization layer and is electrically connected to the source/drain metal layer and the capacitor metal layer through a third via hole respectively;
   wherein a capacitor structure is formed, wherein a first plate of the capacitor structure comprises the active region and the light shielding metal layer which are electrically connected, and a second plate of the capacitor structure comprises the anode and the capacitor metal layer which are electrically connected;

wherein the anode and the active region are disposed correspondingly, and at least two insulating layers are disposed between the anode and the active region;

wherein the light shielding metal layer and the capacitor metal layer are disposed correspondingly, and at least two insulating layers are disposed between the light shielding metal layer and the capacitor metal layer.

2. The display panel according to claim 1, wherein the two insulating layers disposed between the anode and the active region comprise an interlayer dielectric layer and a planarization layer.

3. The display panel according to claim 2, wherein the two insulating layers disposed between the light shielding metal layer and the capacitor metal layer comprise a buffer layer and an interlayer dielectric layer.

4. The display panel according to claim 3, wherein the display panel comprises:
the active region comprises a channel region and a source region and a drain region disposed on both sides of the channel region;
a gate stack disposed on the active region and covering the channel region, the interlayer dielectric layer covering the active region and the gate stack;
the capacitor metal layer is disposed above the interlayer dielectric layer and spaced apart from the source/drain metal layer, the planarization layer covers the source/drain metal layer and the capacitor metal layer.

5. The display panel according to claim 4, wherein a projection of the capacitor metal layer on the substrate separates from a projection of the active region on the substrate.

6. The display panel according to claim 4, wherein a projection of the light shielding metal layer on the substrate covers a projection of the capacitor metal layer on the substrate.

7. The display panel according to claim 4, wherein a projection of the anode on the substrate covers a projection of the active region on the substrate.

8. A method of fabricating a display panel, wherein the method comprises the steps of:
providing a substrate;
forming a light shielding metal;
forming a buffer layer covering the light shielding metal layer;
forming an active region, the active region is located on the buffer layer and is electrically connected to the light shielding metal layer through a first via hole to form a first plate of a capacitor structure; wherein at least two insulating layers covers the first plate;
forming an interlayer dielectric layer covering the active region;
forming a source/drain metal layer, the source/drain metal layer is disposed on the interlayer dielectric layer;
forming a capacitor metal layer, wherein the capacitor metal layer is disposed above the interlayer dielectric layer;
forming a planarization layer, wherein the planarization layer covers the capacitor metal layer;
forming an anode, wherein the anode is disposed on the planarization layer, and is electrically connected to the source/drain metal layer and the capacitor metal layer through via holes respectively; wherein the anode is electrically connected to the capacitor metal layer to form a second plate of the capacitor structure;
wherein the anode and the active region are disposed correspondingly, and at least two insulating layers are disposed between the anode and the active region;
wherein the light shielding metal layer and the capacitor metal layer are disposed correspondingly, and at least two insulating layers are disposed between the light shielding metal layer and the capacitor metal layer;
a light emitting structure is formed on the second plate.

9. The method of fabricating a display panel according to claim 8, wherein the at least two insulating layers disposed between the anode and the active region comprise an interlayer dielectric layer and a planarization layer.

10. The method of fabricating a display panel according to claim 9, wherein the two insulating layers disposed between the light shielding metal layer and the capacitor metal layer comprise a buffer layer and an interlayer dielectric layer.

11. The method of fabricating a display panel according to claim 10, wherein
the active region comprises a channel region and a source region and a drain region on both sides of the channel region.

12. The method of fabricating a display panel according to claim 11, wherein after the forming the active region, the method further comprises the steps of:
forming a gate stack on the active region overlying the channel region;
wherein the interlayer dielectric layer covers, the active region and the gate stack.

13. The method of fabricating a display panel according to claim 12, wherein
the source/drain metal layer disposed on the interlayer dielectric layer is electrically connected to the source region and drain region through a via hole penetrating the interlayer dielectric layer;
the capacitor metal layer s disposed above the interlayer dielectric layer is spaced apart from the source/drain metal layer;
the planarization layer covers the source/drain metal layer and the capacitor metal layer;
the light emitting structure is located on the anode.

14. The method of fabricating a display panel according to claim 8, wherein a projection of the capacitor metal layer on the substrate separates from a projection of the active region on the substrate.

15. The method of fabricating a display panel according to claim 8, wherein a projection of the light shielding metal layer on the substrate covers a projection of the capacitor metal layer on the substrate.

16. The method of fabricating a display panel according to claim 8, wherein a projection of the anode on the substrate covers a projection of the active region on the substrate.

* * * * *